(12) United States Patent
Ishihara

(10) Patent No.: US 9,502,223 B2
(45) Date of Patent: Nov. 22, 2016

(54) SPUTTERING APPARATUS, TARGET AND SHIELD

(71) Applicant: CANON ANELVA CORPORATION, Kawasaki (JP)

(72) Inventor: Shigenori Ishihara, Yokohama (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 256 days.

(21) Appl. No.: 14/297,695

(22) Filed: Jun. 6, 2014

(65) Prior Publication Data

US 2014/0284210 A1    Sep. 25, 2014

Related U.S. Application Data

(63) Continuation of application No. PCT/JP2012/005465, filed on Aug. 30, 2012.

(30) Foreign Application Priority Data

Dec. 12, 2011    (JP) .................. 2011-271663

(51) Int. Cl.
  *C23C 14/00*    (2006.01)
  *H01J 37/34*    (2006.01)
  *C23C 14/34*    (2006.01)

(52) U.S. Cl.
  CPC ........ *H01J 37/3411* (2013.01); *C23C 14/3407* (2013.01); *H01J 37/3414* (2013.01); *H01J 37/3417* (2013.01); *H01J 37/3435* (2013.01); *H01J 37/3441* (2013.01)

(58) Field of Classification Search
  CPC .................. H01J 37/3411; H01J 34/3414
  See application file for complete search history.

(56) References Cited

U.S. PATENT DOCUMENTS 7,981,262 B2    7/2011    Pavloff et al.
8,043,487 B2    10/2011   Li et al.
(Continued)

FOREIGN PATENT DOCUMENTS

CN    1693531 A    11/2005
CN    1896298 A    1/2007
(Continued)

OTHER PUBLICATIONS

Office Action (Notice of Preliminary Rejection) issued on Nov. 2, 2015, by the Korean Intellectual Property Office in corresponding Korean Patent Application No. 10-2014-7019008, with an English translation of the Office Action. (10 pages).

(Continued)

*Primary Examiner* — Keith Hendricks
*Assistant Examiner* — Timon Wanga
(74) *Attorney, Agent, or Firm* — Buchanan Ingersoll & Rooney PC

(57) ABSTRACT

A sputtering apparatus includes a backing plate, a fixing portion, and a shield surrounding the periphery of a target and having an opening. The fixing portion fixes the target to the backing plate by pressing the peripheral portion of the target against the backing plate. The shield includes a facing portion facing the backing plate without the fixing portion intervening between them, and an outer portion formed outside the facing portion. The gap between the facing portion and the backing plate is smaller than the gap between the outer portion and the backing plate. The inner surface of the shield, which faces a processing space, includes a portion which inclines such that the distance between the inner surface and the backing plate decreases from the outer portion to the facing portion.

10 Claims, 8 Drawing Sheets

(56) References Cited

U.S. PATENT DOCUMENTS

| | | | |
|---|---|---|---|
| 9,127,362 | B2 | 9/2015 | Scheible et al. |
| 2003/0155235 | A1 | 8/2003 | Miyashita et al. |
| 2007/0012558 | A1 | 1/2007 | White et al. |
| 2007/0012559 | A1 | 1/2007 | Hosokawa et al. |
| 2007/0012663 | A1 | 1/2007 | Hosokawa et al. |
| 2007/0084720 | A1 | 4/2007 | Hosokawa et al. |
| 2011/0278165 | A1* | 11/2011 | Rasheed ............... C23C 14/35 204/298.11 |
| 2012/0061238 | A1* | 3/2012 | Feldman-Peabody .. H01J 37/34 204/298.13 |

FOREIGN PATENT DOCUMENTS

| | | | |
|---|---|---|---|
| CN | 101235482 | A | 8/2008 |
| CN | 102246270 | A | 11/2011 |
| EP | 1 314 795 | A1 | 5/2003 |
| EP | 1 953 257 | A1 | 8/2008 |
| GB | 2 199 340 | A | 7/1988 |
| JP | H01-152270 | A | 6/1989 |
| JP | 06-108241 | A | 4/1994 |
| JP | 09-003639 | A | 1/1997 |
| JP | 2001-131743 | A | 5/2001 |
| JP | 2002-069610 | A | 3/2002 |
| JP | 2002-146524 | A | 5/2002 |
| JP | 2003-226967 | A | 8/2003 |
| JP | 2005-314773 | A | 11/2005 |
| KR | 2007-0046765 | A | 5/2007 |
| WO | 2010/114823 | A2 | 10/2010 |

OTHER PUBLICATIONS

Office Action (Notification of the First Office Action) issued on Jun. 17, 2015, by the State Intellectual Property Office of the People's Republic of China in corresponding Chinese Patent Application No. 201280061176.7, and an English Translation of the Office Action. (13 pages).

The extended European search report issued on Jul. 3, 2015, by the European Patent Office in corresponding European Patent Application No. 12857644.4-1353. (6 pages).

International Search Report (PCT/ISA/210) mailed on Oct. 9, 2012, by the Japanese Patent Office as the International Searching Authority for International Application No. PCT/JP2012/005465.

Written Opinion (PCT/ISA/237) mailed on Oct. 9, 2012, by the Japanese Patent Office as the International Searching Authority for International Application No. PCT/JP2012/005465.

International Preliminary Report on Patentability (PCT/IPEA/409) mailed on Feb. 20, 2014, by the Japanese Patent Office as the International Examining Authority for International Application No. PCT/JP2012/005465.

* cited by examiner

SPUTTERING APPARATUS, TARGET AND SHIELD

This application is a continuation of International Patent Application No. PCT/JP2012/005465 filed on Aug. 30, 2012, and claims priority to Japanese Patent Application No. 2011-271663 filed on Dec. 12, 2011, the entire content of both of which is incorporated herein by reference.

TECHNICAL FIELD

The present invention relates to a sputtering apparatus, and a target and shield to be incorporated into the sputtering apparatus.

BACKGROUND ART

In the manufacture of an integrated circuit, display panel, disk, or the like, sputtering can be used to form a film on a substrate such as a semiconductor wafer, glass panel, or resin disk. Sputtering is a deposition technique that forms a film by colliding ions against the surface of a target, and depositing particles emitted from the surface on a substrate. The target is fixed to a backing plate. A cooling means cools the backing plate, thereby cooling the target. The backing plate also functions as an electrode for applying a voltage to the target.

CITATION LIST

Patent Literature

PTL 1: Japanese Patent Laid-Open No. 2003-226967

SUMMARY OF INVENTION

Technical Problem

FIG. 8 is a view formed by the inventor of the application concerned in order to explain the problem of the invention. FIG. 8 schematically shows a peripheral portion of a target 5 in a sputtering apparatus. The sputtering apparatus can include a backing plate 7, a fixing portion 13 for fixing the target 5 to the backing plate 7, and a shield 14 surrounding the periphery of the target 5. The fixing portion 13 can be fixed to the backing plate 7 by screws or the like so as to press the target 5 against the backing plate 7. The shield 14 can be arranged around the target 5 so as to cover the fixing portion 13. Ions generated by discharge caused by a voltage applied between a substrate holding portion 4 for holding a substrate S and the backing plate 7 collide against the target 5, and the target 5 emits particles. These particles may be deposited not only on the substrate S on which a film is to be formed, but also on the shield 14, thereby forming a deposit DP. If the deposit DP peels off from the shield 14, the substrate S or a processing space 12 inside a chamber wall 1 of the sputtering apparatus may be contaminated.

The formation of the deposit DP can be conspicuous in a portion close to the surface of the target 5, that is, close to the portion that emits particles when the ions collide against it. Therefore, the portion inside the shield 14 (the portion opposite to the target 5) may be spaced apart from the target 5. Since, however, a deposit is formed on the fixing portion 13 and the like instead of the shield 14, the shield 14 cannot achieve the intended object.

The present invention has been made in consideration of the recognition of the above-mentioned problem by the present inventor, and provides a technique advantageous in reducing the formation of a deposit on the shield and the fixing portion for fixing the target.

Solution to Problem

The first aspect of the present invention is a sputtering apparatus which includes a backing plate, a fixing portion configured to fix a target to the backing plate, and a shield surrounding a periphery of the target, and forms a film on a substrate in a processing space by sputtering, wherein the shield has an opening, the fixing portion is configured to fix the target to the backing plate by pressing a peripheral portion of the target against the backing plate, the shield includes a facing portion which faces the backing plate without the fixing portion intervening therebetween, and an outer portion formed outside the facing portion, and a gap between the facing portion and the backing plate is smaller than a gap between the outer portion and the backing plate, and an inner surface of the shield, which faces the processing space, includes a portion which inclines such that a distance between the inner surface and the backing plate decreases from the outer portion to the facing portion.

The second aspect of the present invention is a shield arranged to surround a periphery of a target in a sputtering apparatus which includes a backing plate, and a fixing portion configured to fix the target to the backing plate, and forms a film on a substrate in a processing space by sputtering, wherein the shield has an opening, the fixing portion is configured to fix the target to the backing plate by pressing a peripheral portion of the target against the backing plate, the shield includes a facing portion which faces the backing plate without the fixing portion intervening therebetween, and an outer portion formed outside the facing portion, and a gap between the facing portion and the backing plate is smaller than a gap between the outer portion and the backing plate, and an inner surface of the shield, which faces the processing space, includes a portion which inclines such that a distance between the inner surface and the backing plate decreases from the outer portion to the facing portion.

The third aspect of the present invention is a target to be used in a sputtering apparatus, including a main body, and a flange surrounding the main body, wherein the flange has an annular recess.

Advantageous Effects of Invention

The present invention provides a technique advantageous in reducing the formation of a deposit on the shield and the fixing portion configured to fix the target.

Other features and advantages of the present invention will be apparent from the following explanation taken in conjunction with the accompanying drawings. Note that the same reference numerals denote the same or similar parts in the accompanying drawings.

BRIEF DESCRIPTION OF DRAWINGS

The accompanying drawings, which are incorporated in and constitute a part of the specification, illustrate embodiments of the invention and, together with the description, serve to explain the principles of the invention.

DESCRIPTION OF EMBODIMENTS

Specific embodiments of the present invention will be explained below with reference to the accompanying drawings, but they are not intended to limit the invention.

Figure 1:
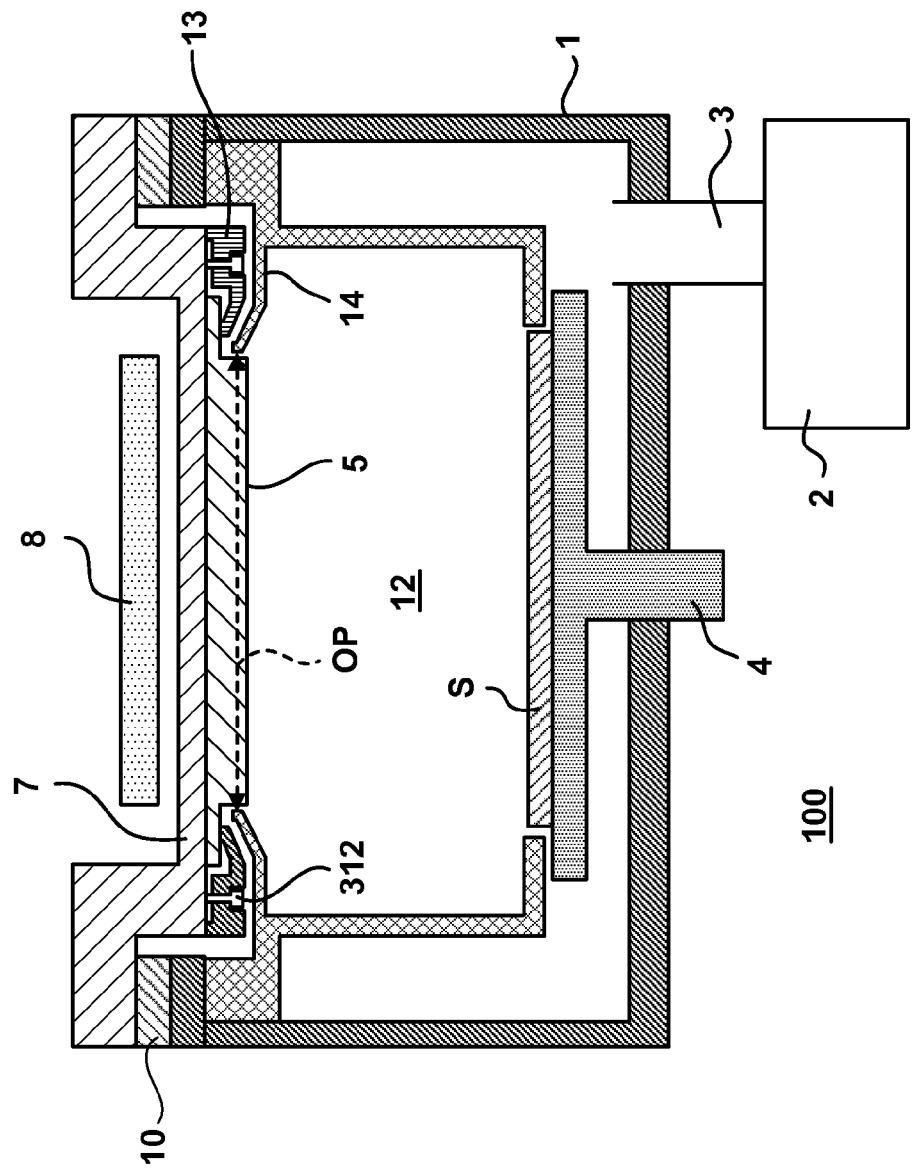
FIG. 1 is a view showing the basic arrangement of a sputtering apparatus of an embodiment of the present invention.

First, the basic arrangement of one embodiment of a sputtering apparatus of the present invention will be explained with reference to FIG. 1. A sputtering apparatus 100 of one embodiment of the present invention can include a backing plate 7, a fixing portion 13 for fixing a target 5 to the backing plate 7, and a shield 14 surrounding the periphery of the target 5. The fixing portion 13 can be fixed to the backing plate 7 by fastening parts 312 such as screws so as to press the target 5 against the backing plate 7. The backing plate 7 can include a conductive sheet or the like from the viewpoint of the thermal conductivity. The target 5 is exposed to a plasma generated by discharge, and hence can expand because the temperature rises. Accordingly, the fixing portion 13 can fix the target 5 so as to permit the expansion of the target 5. The shield 14 can be arranged around the target 5 so as to cover the fixing portion 13. This can suppress the temperature rise of the fixing portion 13. The backing plate 7 can be fixed to a chamber wall 1 with an insulating member 10 intervening between them. The backing plate 7 can form a processing vessel together with the chamber wall 1.

The sputtering apparatus 100 can be so configured as to form a film on a substrate S by sputtering in a processing space 12 separated from the external space by the chamber wall 1. More specifically, ions generated by discharge caused by a voltage applied between a substrate holding unit 4 for holding the substrate S and the backing plate 7 collide against the target 5, and the target 5 emit particles. These particles are deposited on the substrate S, thereby forming a film on the substrate S. The particles from the target 5 may be deposited not only on the substrate S but also on the shield 14, thereby forming a deposit. The processing chamber 12 is exhausted and evacuated by an exhaust device 2 such as a turbo molecular pump through an exhaust port 3 formed in the chamber wall 1. A sputtering gas (for example, argon) can be supplied to the processing space 12 through a gas supply unit (not shown).

The sputtering apparatus 100 can include a magnet 8 that provides a magnetic field around the target 5, and can be configured as a magnetron sputtering apparatus. The magnet 8 can be arranged such that the magnet 8 and target 5 sandwich the backing plate 7. The target 5 can entirely be made of a target material. However, the target 5 may also have an arrangement in which a target material is joined by soldering or the like on a plate member (for example, a plate member made of oxygen-free copper) in contact with the backing plate 7.

Figure 2:
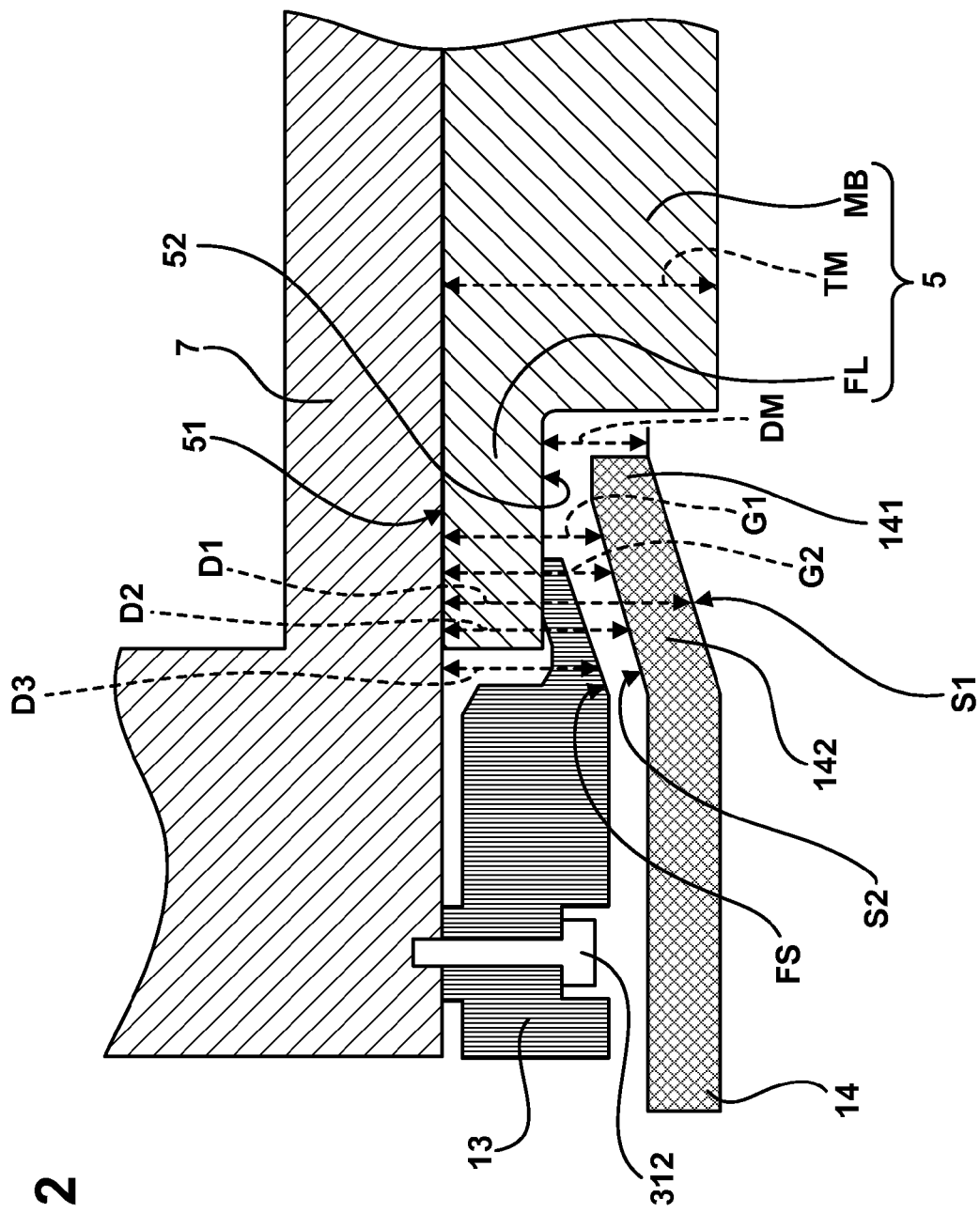
FIG. 2 is a view showing a partial arrangement of a sputtering apparatus of the first embodiment of the present invention.

A sputtering apparatus of the first embodiment of the present invention will be explained below with reference to FIG. 2 in addition to FIG. 1. The shield 14 has an opening OP. The target 5 can include a main body MB arranged inside the opening OP of the shield 14, and a flange FL surrounding the main body MB. The flange FL has a first surface 51 as a surface on the side of the backing plate 7, and a second surface 52 as a surface opposite to the first surface 51. The fixing portion 13 can be configured to fix the target 5 to the backing plate 7 by pressing the flange FL as a peripheral portion of the target 5 against the backing plate 7.

The shield 14 includes a facing portion 141 facing the backing plate 7 without the fixing portion 13 intervening between them, and an outer portion 142 formed outside the facing portion 141. The outer portion 142 is arranged outside the facing portion 141 with respect to the opening OP. A gap G1 between the backing plate 7 and the facing portion 141 facing the backing plate 7 without the fixing portion 13 intervening between them is preferably smaller than a gap G2 between the outer portion 142 and the backing plate 7. This is effective to, for example, prevent particles emitted from the target 5 from reaching the fixing portion 13 through the gap between the shield 14 and target 5 and being deposited on the fixing portion 13. This is also advantageous in positioning the facing portion 141 of the shield 14 close to the backing plate 7, and this is effective to reduce the formation of a deposit on the facing portion 141 by the particles emitted from the target 5. Note that when the target 5 is fixed to the backing plate 7 by the fixing portion 13, a portion facing the backing plate 7 without the fixing portion 13 intervening between them when the target 5 is removed is the facing portion 141.

Furthermore, an inner surface S1 of the shield 14, which faces the processing space 12, preferably has a portion (to be referred to as a first inclining portion hereinafter) that inclines such that a distance D1 between the inner surface S1 and backing plate 7 decreases from the outer portion 142 to the facing portion 141. The first inclining portion may be a linearly inclining portion, or a portion that inclines to form a curve, in a section exemplified in FIG. 2.

In addition, a surface FS of the fixing portion 13, which faces the processing space 12, preferably has a portion (to be referred to as a second inclining portion hereinafter) that inclines such that a distance D3 between the surface FS and backing plate 7 decreases toward the inside of the opening OP of the shield 14, and a surface S2 of the shield 14, which is opposite to the inner surface S1, preferably has a portion (to be referred to as a third inclining portion hereinafter) that inclines such that a distance D2 between the surface S2 and backing plate 7 decreases from the outer portion 142 to the facing portion 141. In this arrangement in which the second inclining portion is formed on the fixing portion 13 and the third inclining portion is formed on the surface S2 of the shield 14, which faces the second inclining portion, the facing portion 141 of the shield 14 can be positioned closer to the backing plate 7 or the flange FL of the target 5. This makes it possible to reduce the formation of a deposit on the facing portion 141 by the particles emitted from the target 5.

A minimum distance DM between the inner surface S1 of the shield 14, which faces the processing space 12, and the backing plate 7 is preferably smaller than a maximum thickness TM of the target 5. This is also effective to reduce the formation of a deposit on the facing portion 141 by the particles emitted from the target 5.

Figure 3:
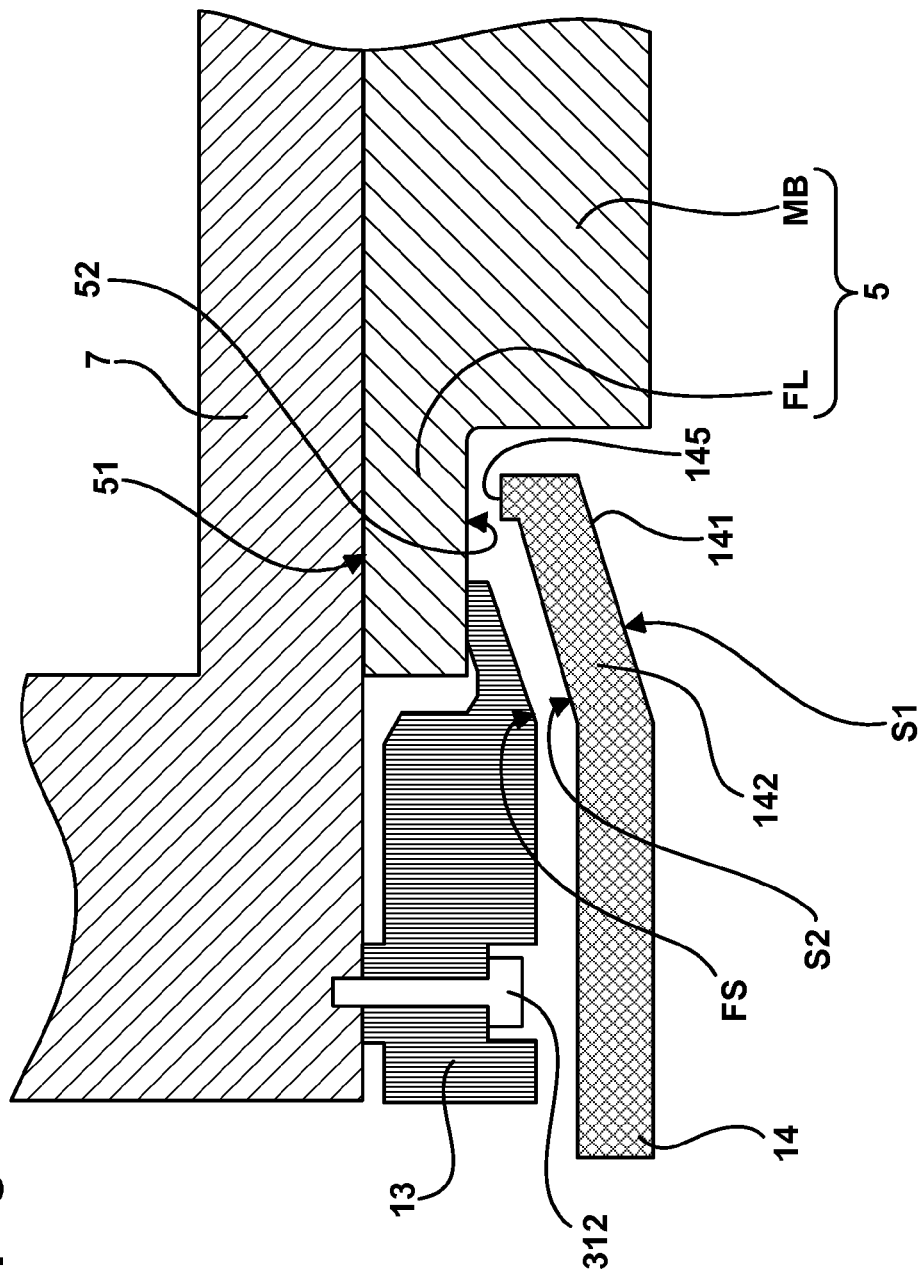
FIG. 3 is a view showing a partial arrangement of a sputtering apparatus of the second embodiment of the present invention.

Next, a sputtering apparatus of the second embodiment of the present invention will be explained with reference to FIG. 3 in addition to FIG. 1. Note that items not particularly mentioned in the second embodiment can follow those of the first embodiment. In the second embodiment, as exemplified in FIG. 3, a facing portion 141 of a shield 14 includes a projection 145 that projects toward a backing plate 7. This is effective to prevent particles emitted from a target 5 from reaching a fixing portion 13 through the gap between the shield 14 and target 5 and being deposited on the fixing portion 13.

Figure 4:
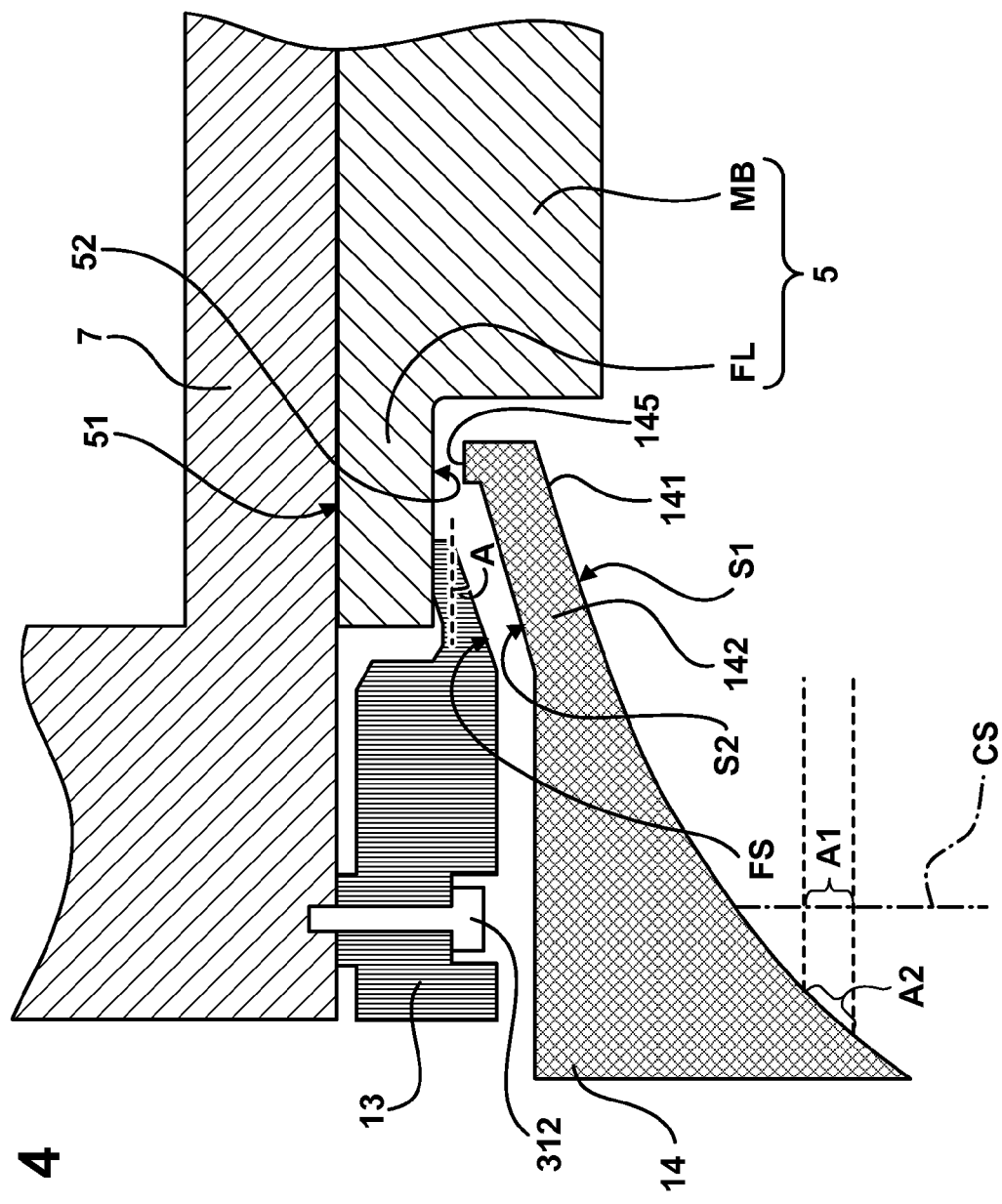
FIG. 4 is a view showing a partial arrangement of a sputtering apparatus of the third embodiment of the present invention.

A sputtering apparatus of the third embodiment of the present invention will now be explained with reference to FIG. 4 in addition to FIG. 1. Note that items not particularly mentioned in the third embodiment can follow those of the first and second embodiments. In the third embodiment, a third inclining portion formed on an inner surface S1 of a shield 14 is made larger than that in the first embodiment, and extended outward ("outward" means the outside of an opening OP of the shield 14) from a region where a fixing portion 13 is formed. This structure contributes to increasing the strength of the shield 14. This structure can also increase the area of the inner surface of the shield, when compared to a shield having a cylindrical surface CS as exemplified by the dotted lines. Therefore, the structure is advantageous in decreasing the thickness of a deposit formed on the inner surface of the shield. For example, when the volume of a deposit formable in a region A1 of the cylindrical surface CS and the volume of a deposit formable in a region A2 of the shield 14 are equal, the thickness of the deposit formed in the region A2 is smaller than that of the deposit formed in the region A1, because the region A2 is wider than the region A1. That is, the third embodiment is effective to decrease the thickness of a deposit formed on the inner surface S1 of the shield 14, thereby preventing the peel-off of the deposit from the inner surface S1.

Figure 5:
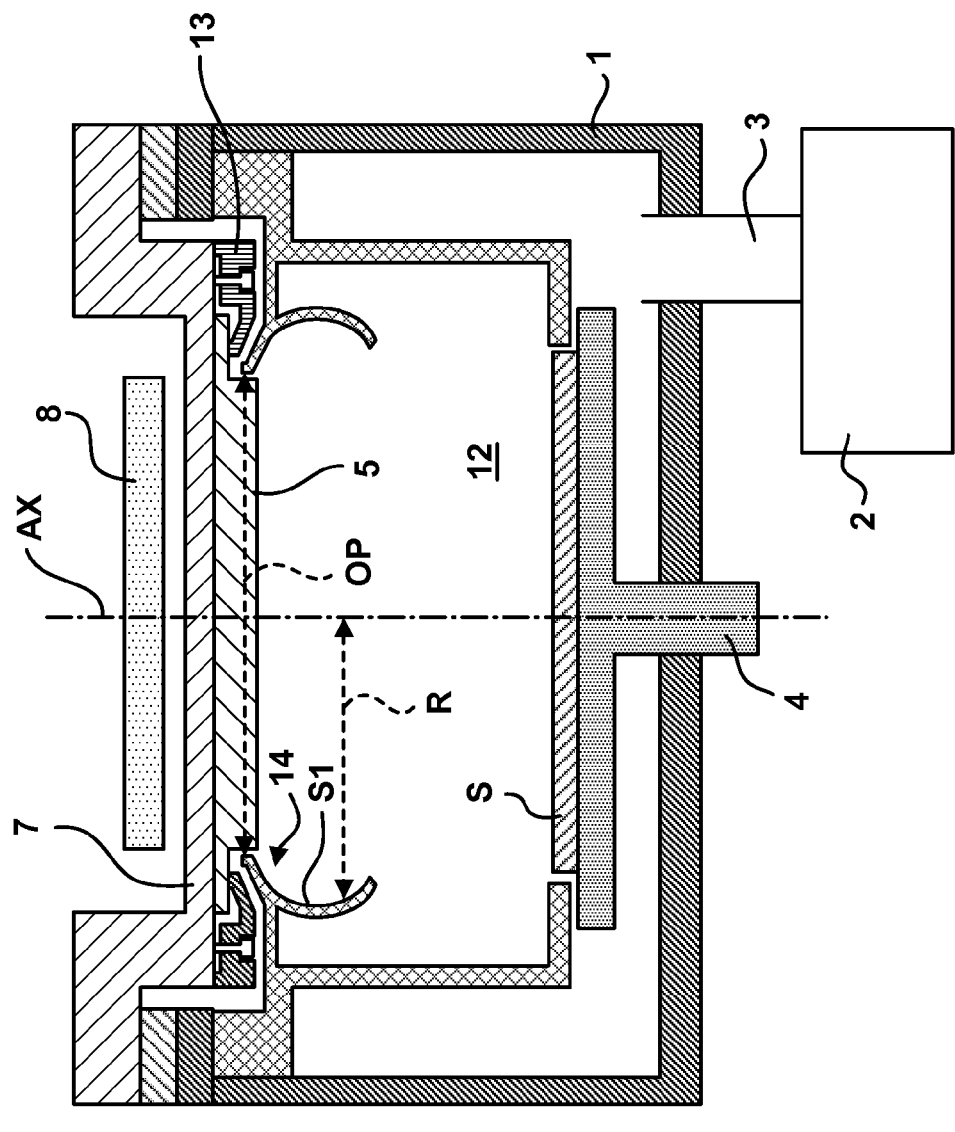
FIG. 5 is a view showing the arrangement of a sputtering apparatus of the fourth embodiment of the present invention.

A sputtering apparatus of the fourth embodiment of the present invention will be explained below with reference to FIG. 5. Note that items not particularly mentioned in the fourth embodiment can follow those of the first to third embodiments. In the fourth embodiment, an inner surface S1 of a shield 14, which faces a processing space 12, is so formed that a distance R from a central axis AX of a backing plate 7 first increases and then decreases in the direction away from an opening OP of the shield 14. This is advantageous in preventing particles emitted from a target 5 from scattering outward.

Figure 6:
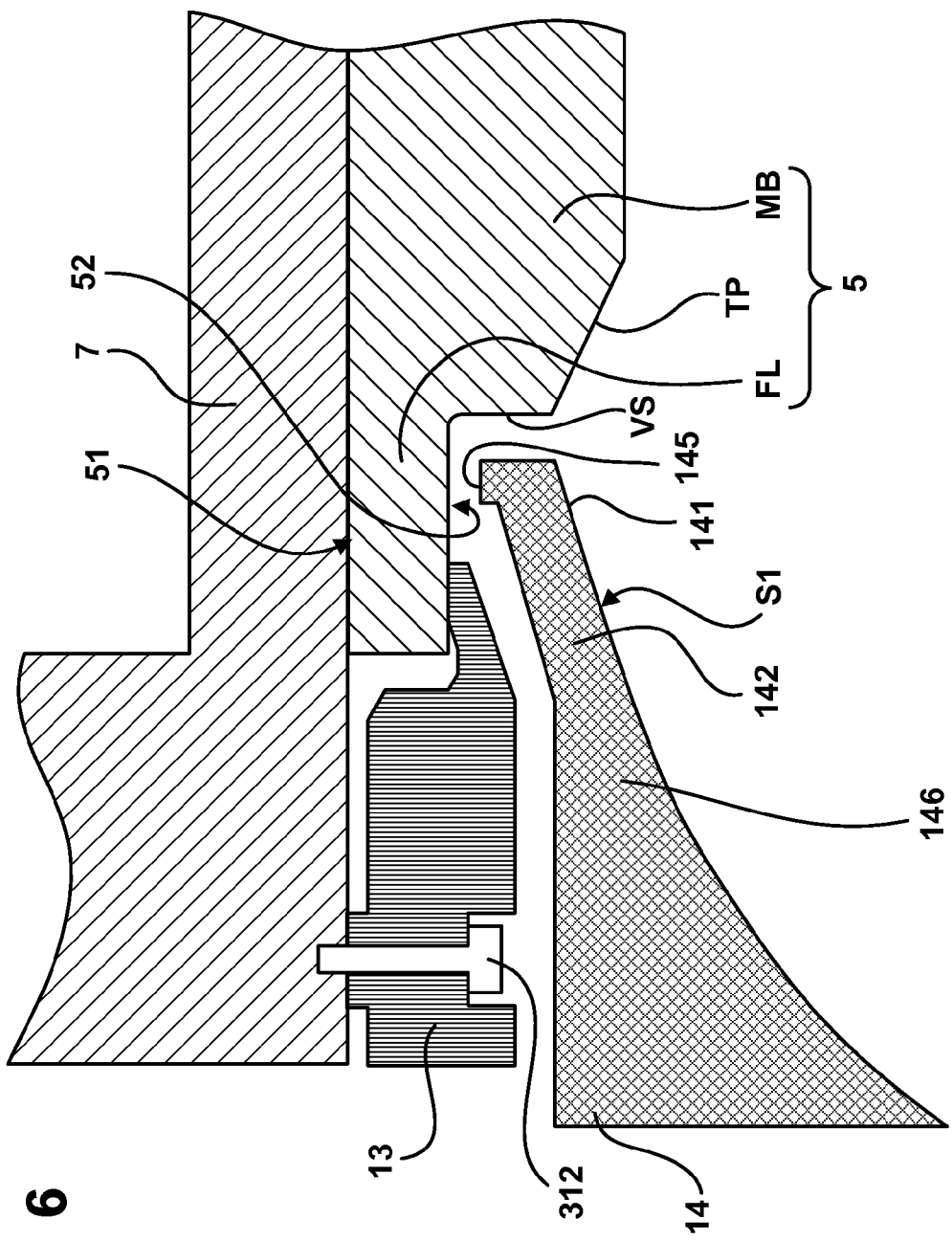
FIG. 6 is a view showing a partial arrangement of a sputtering apparatus of the fifth embodiment of the present invention.

Next, a sputtering apparatus of the fifth embodiment of the present invention will be explained with reference to FIG. 6. Note that items not particularly mentioned in the fifth embodiment can follow those of the first to fourth embodiments. In the fifth embodiment, a main body MB of a target 5 has an inclined surface TP in the peripheral portion. This structure of the target 5 decreases the area of a portion VS perpendicular to a flange FL on the side surface of the main body MB. Particles emitted from the target 5 readily adhere to the portion VS perpendicular to the flange FL on the side surface of the main body MB and form a deposit on the portion VS. If this deposit peels off, a substrate S or processing space 12 may be contaminated. It is, therefore, favorable to form the inclined surface TP in the peripheral portion of the main body MB of the target 5, thereby decreasing the area of the portion VS perpendicular to the flange FL on the side surface of the main body MB. The use of the target 5 as described above can achieve an outstanding effect when reducing, for example, the contamination of the substrate S by the synergy effect obtained by the use of the sputtering apparatus 100 explained in each of the first to fourth embodiments.

Figure 7:
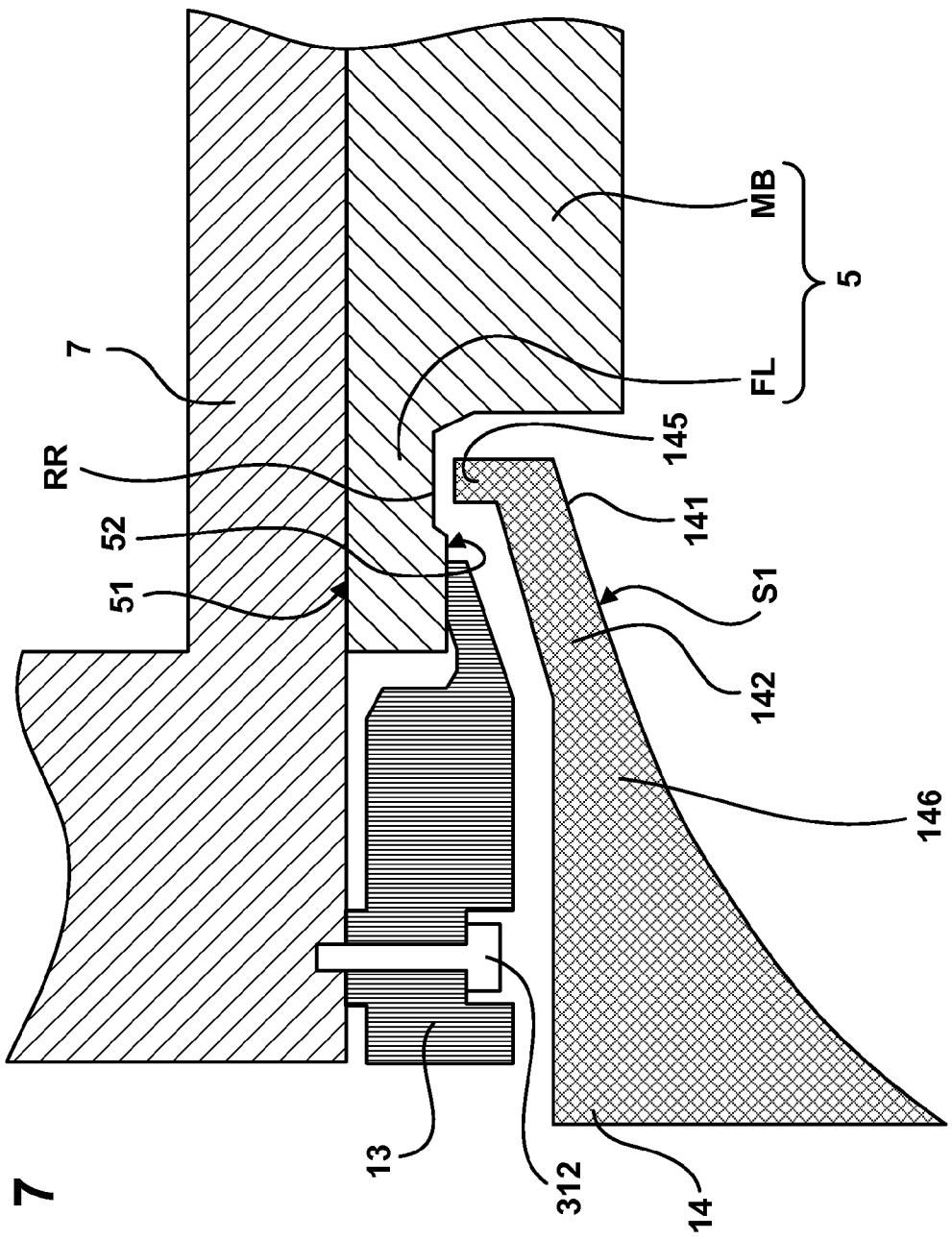
FIG. 7 is a view showing a partial arrangement of a sputtering apparatus of the sixth embodiment of the present invention.
Figure 8:
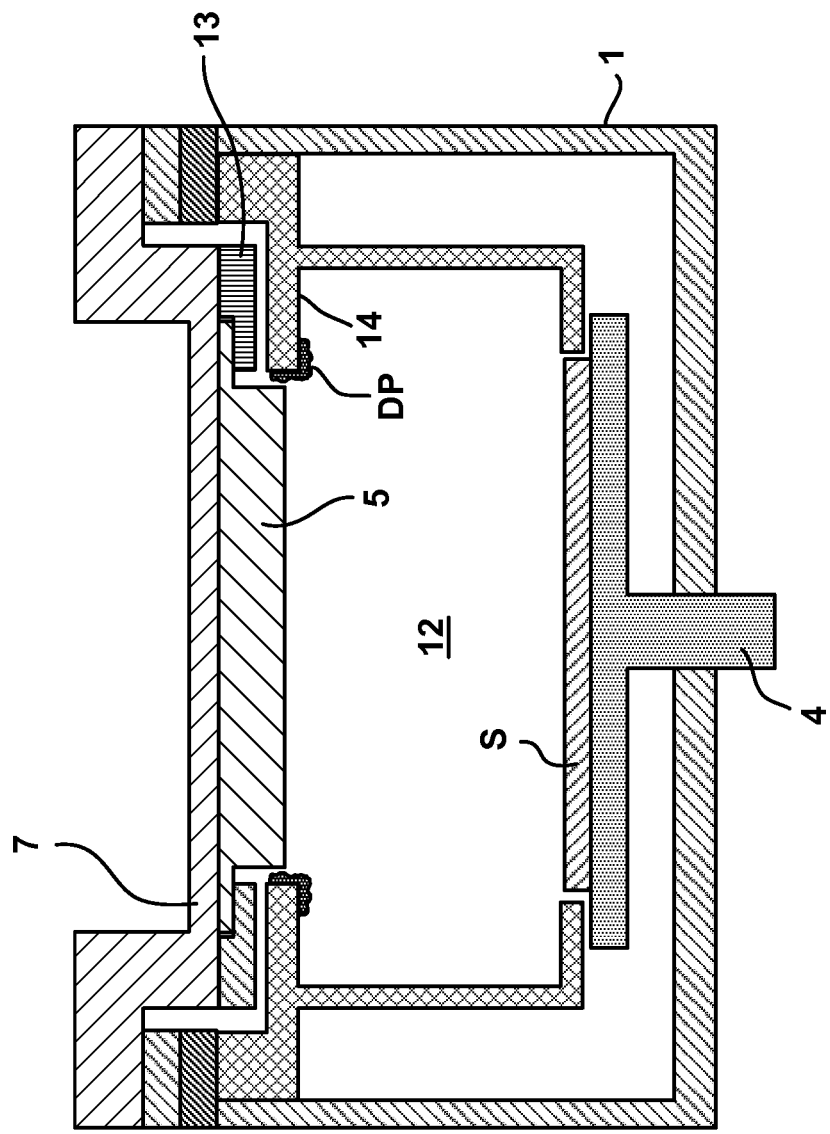
FIG. 8 is a view for explaining the problem.

A sputtering apparatus of the sixth embodiment of the present invention will be explained below with reference to FIG. 7 in addition to FIG. 1. Note that items not particularly mentioned in the sixth embodiment can follow those of the first to fifth embodiments. In the sixth embodiment, a target 5 has an annular recess RR on a flange FL, and a projection 145 formed on a shield 14 faces the recess RR of the target 5. Consequently, a path extending from the processing space 12 to the fixing portion 13 bends, or is formed into the shape of a labyrinth seal. Therefore, this structure is effective to prevent particles emitted from the target 5 from reaching a fixing portion 13 and being deposited on the fixing portion 13.

EXAMPLES

As the target 5, it is possible to use a target material such as a pure metal (for example, titanium), an alloy (for example, an alloy of aluminum and copper), or a dielectric material (for example, $SiO_2$). The target 5 is fixed to the backing plate 7 by the fixing portion 13 so that the contact surface of the target 5 comes in contact with the contact surface of the backing plate 7. The backing plate 7 can be made of a material having a high thermal conductivity, for example, oxygen-free copper. The target 5 can have dimensions such as 180 mm as the outer diameter of the flange FL, 3 mm as the thickness of the flange FL, 160 mm as the outer diameter of the main body (sputtering target portion) MB, and 14 mm as the thickness of the main body MG.

The fixing portion 13 can be made of stainless steel or the like. An angle A (see FIG. 4) between the second inclined surface of the surface FS of the fixing portion 13, which faces the processing space 12, and a surface parallel to the contact surface of the backing plate 7 (this contact surface is typically parallel to the contact surface of the target 5, and the first surface 51 and second surface 52 of the flange FL of the target 5) is preferably 20° to 60°, and can be, for example, 30°.

The shield 14 can be formed by an aluminum alloy or the like. The first inclined portion formed by the shield 14 on the inner surface S1 of the fixing portion 13, which faces the processing space 12, and the third inclined portion formed by the shield 14 on the surface S2 opposite to the inner surface S1 can be, for example, parallel to the second inclined portion of the surface FS of the fixing portion 13, which faces the processing space 12. The gap between the fixing portion 13 and shield 14 can be set to, for example, 1 to 2 mm in order to prevent arc discharge and prevent the generation of a plasma. The thickness of the facing portion 141 and outer portion 142 of the shield 14 is preferably, for example, 6 mm or more.

When forming the projection 145, the gap between the surface of the projection 145, which faces the flange FL, and the flange FL can be, for example, 1 to 2 mm. The gap between the inner portion of the facing portion 141 of the shield 14 and the side surface of the main body MB of the target 5 can be, for example, 1 to 2 mm.

When forming the inclined portion TP of the target 5, the inclined portion TP preferably makes an angle of 15° to 30° with a surface parallel to the contact surface of the target 5, and this angle can be, for example, 25°.

The present invention is not limited to the above embodiments, and various changes and modifications can be made without departing from the spirit and scope of the invention. Therefore, to apprise the public of the scope of the present invention, the following claims are appended.

The invention claimed is:

1. A sputtering apparatus comprising a backing plate, a fixing portion configured to fix a target to the backing plate, and a shield surrounding a periphery of the target, and forms a film on a substrate in a processing space by sputtering, wherein
   the shield has an opening,
   the target includes a main body arranged inside the opening, and a flange surrounding the main body,
   the fixing portion is configured to fix the target to the backing plate by pressing the flange of the target against the backing plate,
   the shield includes a facing portion which faces the flange of the target fixed to the backing plate by the fixing portion such that the fixing portion is not arranged between the facing portion and the flange, and an outer portion formed outside the facing portion, and a gap between the facing portion and the backing plate is smaller than a gap between the outer portion and the backing plate, and
   an inner surface of the shield, which faces the processing space, includes a portion which inclines such that a distance between the inner surface and the backing plate decreases from the outer portion to the facing portion,
   a surface of the fixing portion, which is arranged at a side of the processing space, includes a portion which inclines such that a distance between the surface of the fixing portion and the backing plate decreases toward an inside of the opening, and
   a surface of the shield, which is opposite to the inner surface, includes a portion which inclines such that a distance between the surface of the shield and the backing plate decreases from the outer portion to the facing portion.

2. A sputtering apparatus according to claim 1, wherein the facing portion includes a projection which projects toward the backing plate.

3. A sputtering apparatus according to claim 2, further comprising a target,
   wherein the target includes a main body arranged inside the opening, and a flange surrounding the main body, and
   the target has an annular recess in the flange, and the projection faces the recess.

4. A sputtering apparatus according to claim 1, wherein the shield includes a portion having a thickness which increases in a direction away from the opening.

5. A sputtering apparatus according to claim 1, wherein an inner surface of the shield, which faces the processing space, first increases and then decreases a distance from a central axis of the backing plate in a direction away from the opening.

6. A sputtering apparatus according to claim 1, wherein the target includes a main body arranged inside the opening, and a flange surrounding the main body,
   the main body having an inclined surface in a peripheral portion.

7. A shield arranged to surround a periphery of a target in a sputtering apparatus which comprises a backing plate, and a fixing portion configured to fix the target to the backing plate, and forms a film on a substrate in a processing space by sputtering, wherein
   the shield has an opening,
   the target includes a main body arranged inside the opening, and a flange surrounding the main body,
   the fixing portion is configured to fix the target to the backing plate by pressing a the flange of the target against the backing plate,
   the shield includes a facing portion which faces the flange of the target fixed to the backing plate by the fixing portion such that the fixing portion is not arranged between the facing portion and the flange, and an outer portion formed outside the facing portion, and a gap between the facing portion so as to face the flange via the fixing portion, and the backing plate is smaller than a gap between the outer portion and the backing plate,
   an inner surface of the shield, which faces the processing space, includes a portion which inclines such that a distance between the inner surface and the backing plate decreases from the outer portion to the facing portion,
   a surface of the fixing portion, which faces the processing space, includes a portion which inclines such that a distance between the surface and the backing plate decreases toward an inside of the opening, and
   a surface of the shield, which is opposite to the inner surface, includes a portion which inclines such that a distance between the inner surface and the backing plate decreases from the outer portion to the facing portion.

8. A shield according to claim 7, wherein the facing portion includes a projection which projects toward the backing plate.

9. A shield according to claim 7, wherein the shield includes a portion having a thickness which increases in a direction away from the opening.

10. A shield according to claim 7, wherein an inner surface of the shield, which faces the processing space, first increases and then decreases a distance from a central axis of the backing plate in a direction away from the opening.

* * * * *